United States Patent [19]

Hoffman et al.

[11] Patent Number: 5,117,129

[45] Date of Patent: May 26, 1992

[54] CMOS OFF CHIP DRIVER FOR FAULT TOLERANT COLD SPARING

[75] Inventors: Joseph A. Hoffman, Mannassas; Derwin L. Jallice, Reston; Yogishwar K. Puri, Vienna; Randall G. Richards, Centreville, all of Va.

[73] Assignee: International Business Machines Corporation, Armonk, N.Y.

[21] Appl. No.: 598,300

[22] Filed: Oct. 16, 1990

[51] Int. Cl.$^5$ ............... H03K 19/092; H03K 17/16
[52] U.S. Cl. ................... 307/443; 307/451; 307/473; 307/296.2; 307/296.5; 307/270; 307/584
[58] Field of Search ............ 307/443, 451, 473, 296.2, 307/296.5, 270, 584–585

[56] References Cited

U.S. PATENT DOCUMENTS

| | | | |
|---|---|---|---|
| 4,531,068 | 7/1985 | Kraft et al. | 307/473 |
| 4,570,244 | 2/1986 | Sud et al. | 307/296.3 |
| 4,626,715 | 12/1986 | Ishii | 307/585 |
| 4,734,752 | 3/1988 | Liu et al. | 357/23.4 |
| 4,736,271 | 4/1988 | Mack et al. | 361/91 |
| 4,746,817 | 5/1988 | Barker et al. | 307/451 |
| 4,777,389 | 10/1988 | Wu et al. | 307/443 |
| 4,820,942 | 4/1989 | Chan | 307/542 |
| 4,857,770 | 8/1989 | Partovi et al. | 307/451 |
| 4,914,318 | 4/1990 | Allen | 307/279 |

Primary Examiner—Stanley D. Miller
Assistant Examiner—Margaret Rose Wambach
Attorney, Agent, or Firm—Mark A. Wurm

[57] ABSTRACT

A full swing CMOS logic circuit provides fault tolerant, cold sparing of VLSI logic devices attached to a high speed bus. P-channel FET transistors are formed in an N-well which has a biasing transistor which effectively decouples the circuit when the circuit is not powered. The input/output interface of the cold spares have a high impedance and do not corrupt an interconnected electronic bus. The final drive transistors are reverse biased or clamped to zero to prevent any leakage paths.

2 Claims, 4 Drawing Sheets

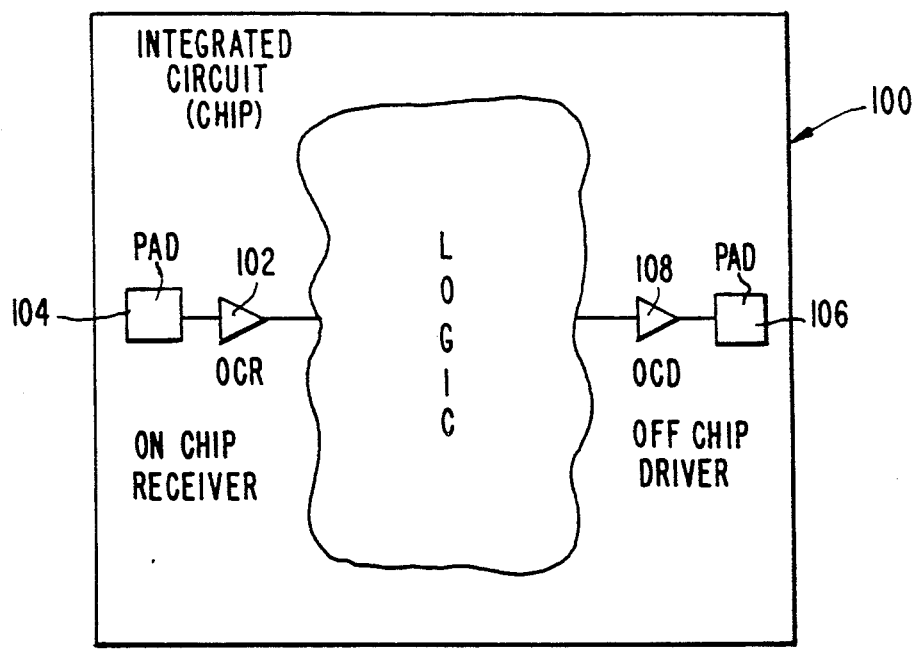
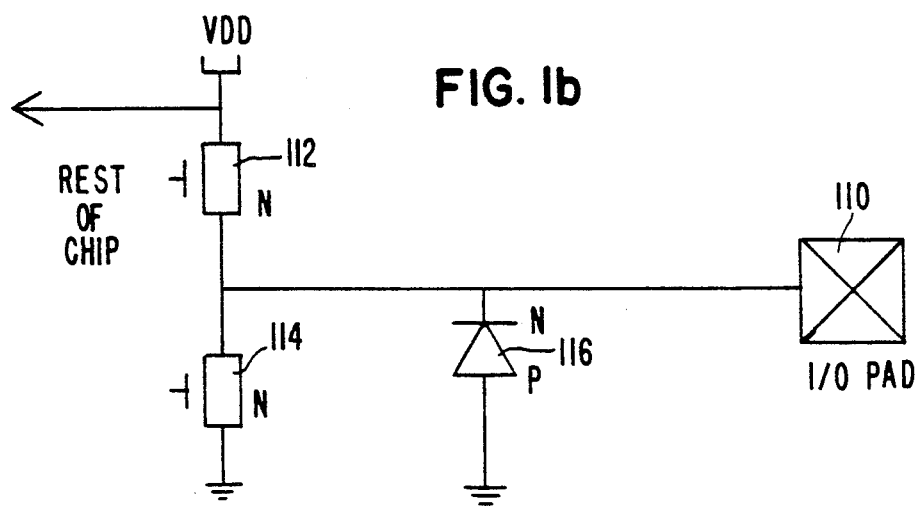
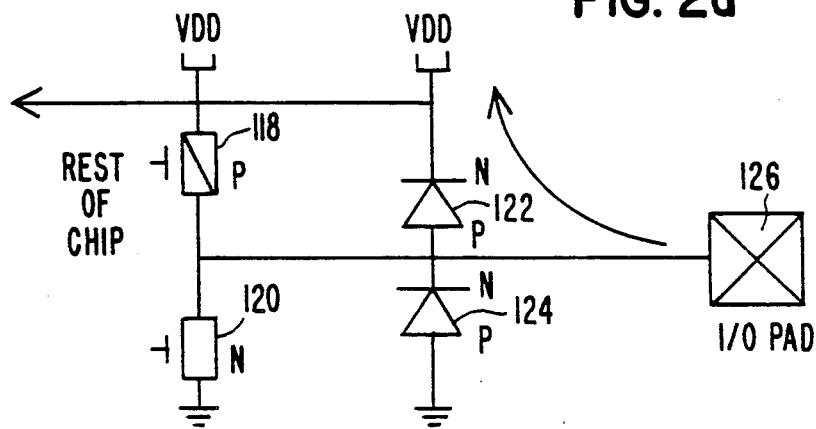

CMOS OFF CHIP DRIVER FOR FAULT TOLERANT COLD SPARING

BACKGROUND OF THE INVENTION

1. Technical Field

The invention disclosed broadly relates to fault tolerant systems having spare assets on the same electronic bus and more particularly relates to a CMOS driver circuit providing cold sparing for VLSI logic circuits attached to a high speed communications bus.

2. Background Art

For fault tolerant systems such as high reliability spacecraft, it is desirable to use cold sparing where VLSI logic devices are attached to a high speed bus without power applied. The term cold spare means a redundant circuit or circuit card that is unpowered while not being used. The absence of power requirements during non-use is a critical feature of a cold spare circuit versus a warm or hot spare circuit which dissipates power while in a standby mode. The input/output interface of the cold spares must be of a high impedance or the attached bus will be corrupted by excessive loading of the bus. CMOS circuitry is desired to be used in logic devices because it provides a degree of radiation immunity and wide thresholds with low power dissipation. This same CMOS circuitry has inherent parasitic devices. Up to now, cold sparing has not been possible with full CMOS logic swings because parasitic diodes present a low impedance to the remaining system, thus corrupting the data bus and defeating the cold spare approach.

OBJECTS OF THE INVENTION

It is therefore an object of the invention to provide cold sparing with a full rail logic swing CMOS Off Chip Driver that presents a high impedance to ground when power is not present.

It is a further object of the invention to provide a CMOS circuit which presents a high impedance to ground no matter what the previous control state of the circuit to insure that when the circuit is inactivated it presents no load to an interconnected electronic bus.

It is yet a further object of the invention to prevent residual paths to ground when a CMOS Off Chip Driver is unpowered.

SUMMARY OF THE INVENTION

These and other objects, features and advantages of the invention are accomplished by the CMOS Off Chip Driver circuit disclosed herein. An N-well bias transistor is used to break the current path that would otherwise exist when power to the circuit is equal to VDD and 5V is applied to the input/output pad. Leakage to the VDD network is prevented by use of a transistor to force the output of the VDD network high. The leakage path through the precharge circuitry is biased to prevent any leakage when the chip is unpowered. Voltage clamps are maintained on the final drive transistors to prevent the gate from rising above ground due to capacitive coupling of any input/output transitions. All P-channel FETs required for cold sparing operations reside in the same N-well biased by a N-well bias transistor. This insures that all P+ diffusions exposed to a 5V input/output signal will not have a current path to VDD through the N-well. Ohmic contact is provided to the VDD and the N-well when power is applied to the circuit.

BRIEF DESCRIPTION OF THE DRAWINGS

These and other objects, features and advantages of the invention will be more fully appreciated with reference to the accompanying figures.

FIG. 1A is a schematic representation of a CMOS VLSI circuit.

FIG. 1B is a circuit representation in detail of an N-channel Off Chip Driver.

FIG. 2A is a circuit representation of a typical CMOS Off Chip Driver.

DESCRIPTION OF THE BEST MODE FOR CARRYING OUT THE INVENTION

Figure 2B:
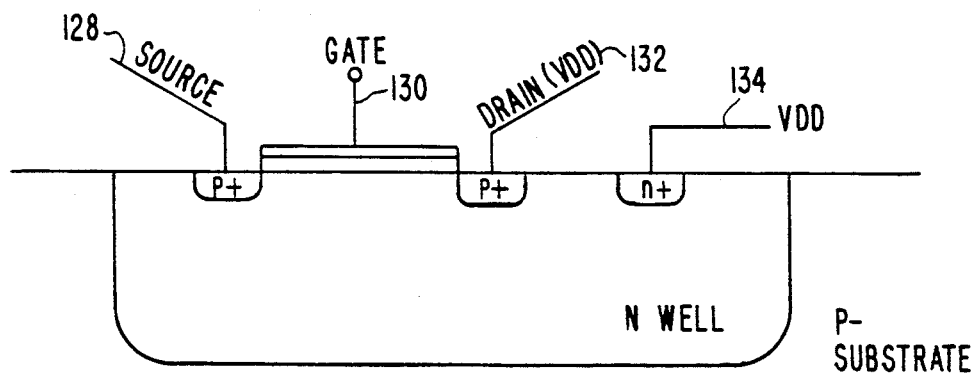
FIG. 2B is a sectional view of an integrated circuit showing a portion of a CMOS Off Chip Driver.

A CMOS VLSI circuit 100 is shown in FIG. 1A and contains an on chip receiver 102 connected to an input/output pad 104. Similarly, input/output pad 106 has connected to it an Off Chip Driver 108. The Off Chip Driver provides a known voltage and current drive to the input/output path 106 so that when the pad is used in an output mode, the Off Chip Driver 108 can provide a known stable drive to a load which may be an electronic bus or another VLSI integrated circuit.

The usual approach to provide cold spares in a VLSI system is to provide a relay in the VDD net of the card or chip that is desired to be cold spared. Using this approach, a typical N-channel field effect transistor is used for the Off Chip Driver. A typical such Off Chip Driver output stage is shown in FIG. 1B. Connected to input/output path 110 are pull up and pull down N-channel transistors 112 and 114. Between the N-channel transistors is an electrostatic discharge protection network consisting of the parasitic N+ diffusion to P-substrate present in the N-channel FETs. This diode is labeled 116. Due to the Vt of the upper N-channel device 112, a full CMOS logic swing is not possible, hence only a TTL compatible output can be generated.

When the power is removed, i.e., VDD equals ground, the card is considered to be in a cold, non-powered spare mode. When attached to a high speed VLSI system bus, 5V signals are applied to the input/output pad. A current path does not exist between the pad and ground, as diode 116 and any parasitic diodes are reverse biased and cannot present a low impedance to ground.

A CMOS representation of an Off Chip Driver is shown in FIG. 2A. A pull up device 118 is a P-channel field effect transistor while the pull down device 120 is an N-channel FET. This generates a full 5V CMOS logic swing. The diodes 122 and 124 represent the electrostatic diode network and the N+/P− parasitic diodes in the N-channel FETs, and the P+/N− well diodes in the P-channel FETs.

When cold sparing is attempted with this type of Off Chip Driver, i.e., VDD is equal to ground and the input/output connection 126 to the system bus is at 5V, the parasitic P+/N− well diode 122 will become forward biased. The resulting current flow will provide power to the VLSI chip, charge up the bulk decoupling capacitance on the VDD net, and present a low impedance to the VDD net and the external system bus.

Figure 2C:
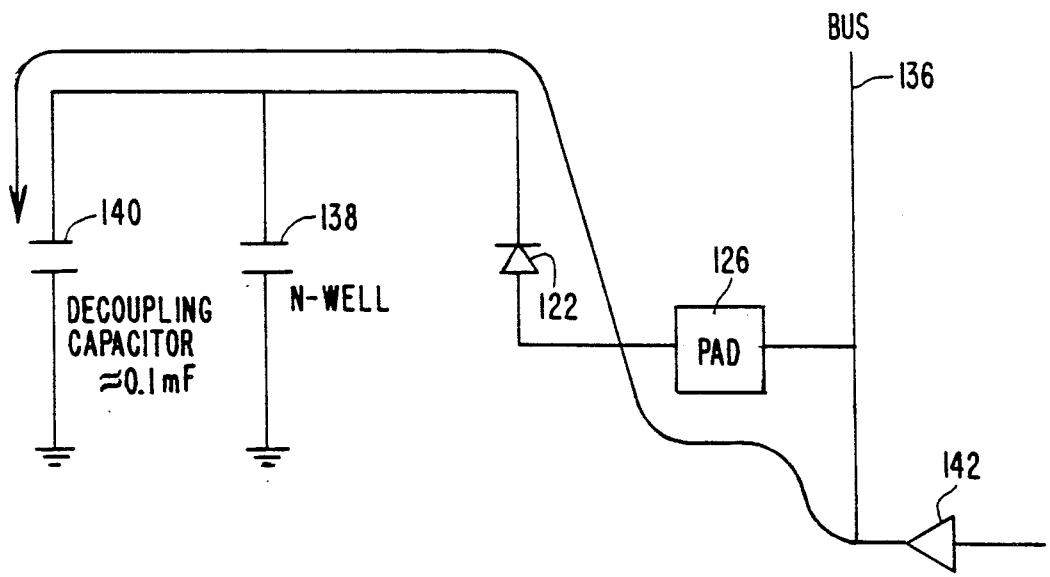
FIG. 2C shows a leakage path of the typical CMOS Off Chip Driver shown in FIG. 2B.

Shown in FIG. 2B is the cross-sectional view of the P-channel transistor residing in the N-well of the CMOS Off Chip Driver integrated circuit. The source 128, gate 130 and drain 132 having a voltage of VDD is shown for transistor 118 of FIG. 2A. The N-well is biased by an N+ connection to VDD at 134. When the device is inactive, a current path exists as shown in FIG. 2C from an external bus where a diode may be forward biased allowing current from the bus to be sunk into the N-well capacitor as well as to the decoupling capacitor 140 which may be on the order of 0.1 microfared. When the transistor 118 inactive and the bus is driven by an output driver 142, the path from the input/output path 126 leads through diode 122 into the capacitors 138 and 140 which can put a variable and significant load on the bus which is being driven by driver 142.

Figure 3A:
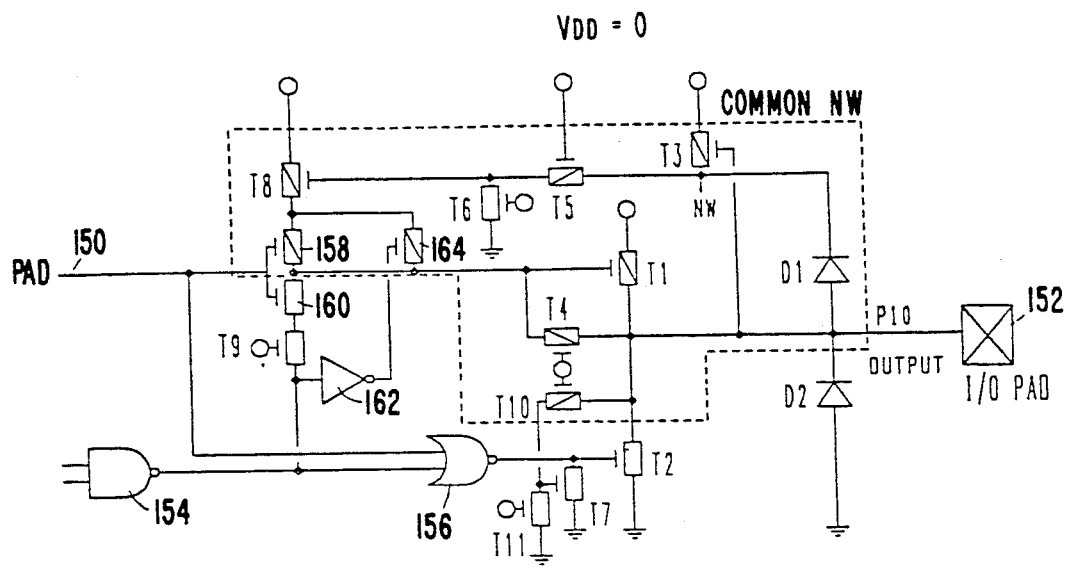
FIG. 3A is a circuit schematic diagram of a full swing CMOS Off Chip Driver of the present invention.

The invention is the CMOS Off Chip Driver for fault tolerant cold sparing shown in FIG. 3A. The circuit is interposed between pad signal 150 and I/O pad 152. A tri-state enable is performed by the combination of NAND gate 154 and NOR gate 156. This allows selection of the active state on the input/output pad 152. The circuit is laid out as shown in FIG. 3A wherein the pad signal goes first to a CMOS inverter formed by P-channel transistor 158 and N-channel transistor 160. An inverter 162 is used to drive a subsequent PMOS transistor 164. A final output transistor T1 drives the input/output pad 152.

The circuit operates as follows. The P+/N−well and N+/P− well diodes are represented by D1 and D2, respectively. To eliminate forward bias of D1, transistor T3 is used to bias the N-well and break the current path that would otherwise exist when VDD is equal to ground, and 5V is applied at the input/output pad 152. The 5V at the input/output pad is also applied to the gate of transistor T3 turning off the diode path to the VDD network through the N-well.

T4 is used to prevent leakage through T1 to the VDD network. When VDD is equal to ground, that is the circuit is inactive, T4 is on and electrically connecting the gate and source of T1. This forces T1 into a high impedance mode. To prevent leakage to the pre-drive circuitry, T8 is used as a switch in a similar manner to T3. When power is applied, T6 pulls the gate of T8 to ground, thus insuring normal circuit operation. When VDD is equal to ground (inactive cold spare), T5 applies an I/O 5V signal to the gate of T8, preventing any leakage.

T9 insures that a leakage path does not exist elsewhere on the pre-drive section of the Off Chip Driver which consist of transistors T8, T9, 158, 160 and 164. As the gate potential equals ground when no power is applied T9 is turned off. Transistor 7 clamps the gate of complementary final drive transistor 2 to ground, preventing any leakage current. When VDD is equal to ground, T7 keeps the gate of T2 from rising above ground, due to capacitive coupling of any I/O transitions. The necessary gate drive is provided from the I/O path through T10. When power is applied, T11 shuts off T7, removing any interference with normal operations.

All the P-channel field effect transistors required for cold sparing operation of this circuit must reside in the same N-well which is biased by T3. This is to insure that all P+ diffusions exposed to the 5V input/output signal will not have a current path to VDD through the N-well.

The drain of T8 is also connected to the N-well providing an ohmic connection to VDD when power is applied. This insures a 5V N-well bias during normal circuit operation.

Figure 3B:
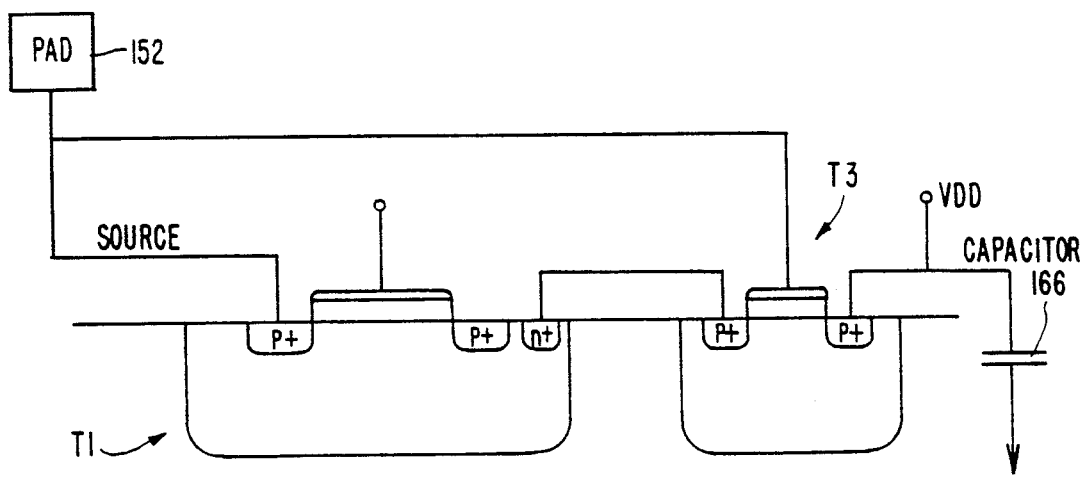
FIG. 3B is a sectional view of an integrated circuit portion of the circuit showing the bias transistor of FIG. 3A.

A cross-sectional view of a P-channel transistor connected across the P-channel biasing transistor T3 is shown in FIG. 3B. Pad 152 is connected to the gate of transistor T3 as well as the source of final drive transistor T1. As the pad voltage goes up, T3 goes off. This prevents any leakage path between the VDD network and any capacitance through capacitor 166.

Figure 4:
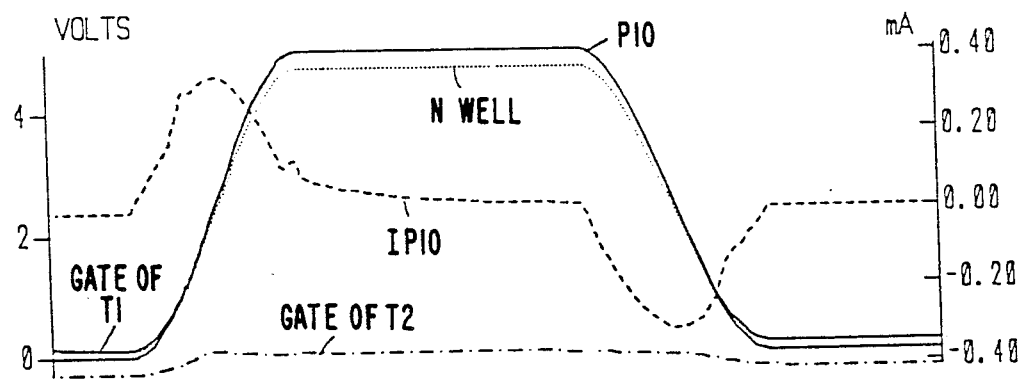
FIG. 4 is a circuit simulation of the I-V characteristics of a CMOS Off Chip Driver according to the present invention.

A circuit simulation of the CMOS On Chip Driver of FIG. 3A is shown in FIG. 4. Output signal point P10 is illustrated having a 5V logic swing. The current into the Off Chip Driver for cold sparing applications where VDD is equal to ground shows current spikes of approximately ±300 uA during the switching of the external net. This is capacitive current due to the capacitance of a final drive transistors charging and discharging. The DC value of input current is zero. Also shown is the N-well which rises and falls with the input/output signal. The gate voltage of the final drive transistor, T1 is shown and the gate voltage of the complementary drive transistor T2 is shown.

Although a specific embodiment has been disclosed, it will be understood by those having skill in the art that changes can be made to the specific embodiment without departing from the spirit and the scope of the invention.

What is claimed is:

1. A CMOS Off Chip Driver circuit comprising:
   an N-well biasing transistor having a source, drain and gate the source being connected to an N-well, the drain connected to a power supply and the gate connected between an input/output pad of the off chip driver circuit and a pair of CMOS final drive transistors;
   the pair of CMOS final drive transistors connected to a precharge CMOS circuit having an input and output, the final drive transistors providing amplification of the precharge CMOS circuit output;
   a pad signal electronically connected to the input of the precharge CMOS drive circuit and to a tri-state enable, the tri-state enable selecting the active state of the input/output pad;
   whereby the N-well biasing transistor electrically biases the N-well to effectively prevent any leakage current when the circuit is in an unpowered state.

2. The CMOS off chip driver circuit of claim 1 wherein leakage control transistors are connected between the tri-state enable and the CMOS final drive transistor to dissipate any stored charge due to the previous logical state of the input/output pad.

* * * * *